United States Patent
Nagai

(10) Patent No.: US 12,225,661 B2
(45) Date of Patent: *Feb. 11, 2025

(54) MULTILAYER SUBSTRATE

(71) Applicant: Murata Manufacturing Co., Ltd., Nagaokakyo (JP)

(72) Inventor: Tomohiro Nagai, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

This patent is subject to a terminal disclaimer.

(21) Appl. No.: 18/208,921

(22) Filed: Jun. 13, 2023

(65) Prior Publication Data
US 2023/0328884 A1    Oct. 12, 2023

Related U.S. Application Data

(60) Division of application No. 17/321,562, filed on May 17, 2021, now abandoned, which is a continuation of application No. PCT/JP2019/048859, filed on Dec. 13, 2019.

(30) Foreign Application Priority Data

Dec. 17, 2018 (JP) ................................. 2018-235085

(51) Int. Cl.
| | |
|---|---|
| *H05K 1/02* | (2006.01) |
| *H05K 1/11* | (2006.01) |
| *H05K 1/18* | (2006.01) |
| *H01P 3/00* | (2006.01) |

(52) U.S. Cl.
CPC ......... *H05K 1/0298* (2013.01); *H05K 1/0284* (2013.01); *H01P 3/00* (2013.01); *H05K 1/0245* (2013.01); *H05K 1/025* (2013.01); *H05K 1/0278* (2013.01); *H05K 1/111* (2013.01); *H05K 1/112* (2013.01); *H05K 1/18* (2013.01)

(58) Field of Classification Search
CPC .. H05K 1/0298; H05K 1/0284; H05K 1/0245; H05K 3/4691; H05K 1/025; H05K 1/0278; H01P 3/00; H01P 5/028; H01P 3/026; H01P 3/04; H01P 3/08
See application file for complete search history.

(56) References Cited

U.S. PATENT DOCUMENTS

| | | | | |
|---|---|---|---|---|
| 9,949,368 | B2 * | 4/2018 | Baba ................... | H05K 1/0218 |
| 2011/0126221 | A1 * | 5/2011 | Kitayama ............. | H05K 1/025 |
| | | | | 720/600 |

OTHER PUBLICATIONS

U.S. Appl. No. 18/208,920, filed Mar. 22, 2021 (allowed claims).*

(Continued)

*Primary Examiner* — Ishwarbhai B Patel
(74) *Attorney, Agent, or Firm* — Keating & Bennett, LLP

(57) ABSTRACT

A multilayer substrate includes an insulator that includes a first region and a second region that is thinner than the first region, and a first signal line and a second signal line that are structured to extend across the first region and the second region. In a region in which the first signal line and the second signal line face each other, a line width of the first signal line and a line width of the second signal line are smaller in the second region than in the first region, and a distance between the first signal line and the second signal line is smaller in the second region than in the first region.

16 Claims, 12 Drawing Sheets

(56) References Cited

OTHER PUBLICATIONS

Nagai, "Multilayer Substrate", U.S. Appl. No. 17/321,562, filed May 17, 2021.
Nagai, "Multilayer Substrate", U.S. Appl. No. 18/208,920, filed Jun. 13, 2023.

* cited by examiner

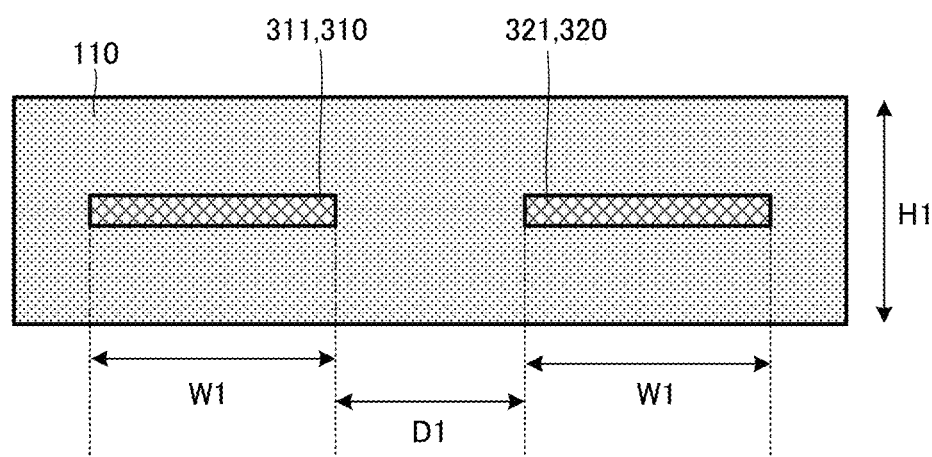
Fig.3A
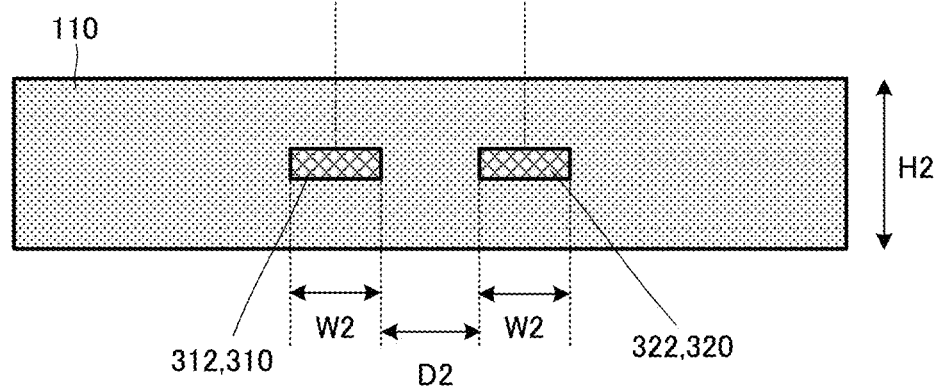
Fig.3B
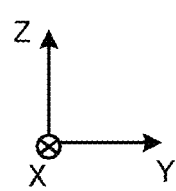

MULTILAYER SUBSTRATE

CROSS REFERENCE TO RELATED APPLICATIONS

This application claims the benefit of priority to Japanese Patent Application No. 2018-235085 filed on Dec. 17, 2018 and is a Divisional Applications of U.S. Ser. No. 17/321,562 filed on May 17, 2021, now abandoned, which is a Continuation Application of PCT Application No. PCT/JP2019/048859 filed on Dec. 13, 2019. The entire contents of each application are hereby incorporated herein by reference.

BACKGROUND OF THE INVENTION

1. Field of the Invention

The present invention relates to a multilayer substrate including a differential line.

2. Description of the Related Art

Conventionally, various types of transmission lines that transmit a high frequency signal have been devised. For example, a transmission line disclosed in International Publication No. 2016/163436 is provided by stacking a plurality of insulator layers on each other. In a direction (a stacking direction) in which the insulator layers are stacked on each other, the thickness of the transmission line is uniform.

However, in a case in which the transmission line including a plurality of signal lines as disclosed in International Publication No. 2016/163436 is bent in the stacking direction, a coupled state between the lines is changed, and desired characteristics may not be obtained.

SUMMARY OF THE INVENTION

Preferred embodiments of the present invention provide multilayer substrates that are each able to significantly reduce or prevent a characteristic change in a bent state, and that also provide predetermined characteristics.

A multilayer substrate according to a preferred embodiment of the present invention includes an insulator that includes a first region and a second region that is thinner than the first region, and a first signal line and a second signal line that extend across the first region and the second region. In a region in which the first signal line and the second signal line face each other, a line width of the first signal line and a line width of the second signal line are smaller in the second region than in the first region, and a distance between the first signal line and the second signal line is smaller in the second region than in the first region.

Accordingly, the multilayer substrate is able to be easily bent in the second region that is thinner than the first region. In addition, in the second region, the line width of the first signal line and the second signal line is small, and the distance of the first signal line and the second signal line is small, so that the coupled state is maintained and the characteristic change is significantly reduced or prevented.

According to preferred embodiments of the present invention, multilayer substrates that are each able to significantly reduce or prevent a characteristic change in a bent state and that provide predetermined characteristics are able to be provided.

The above and other elements, features, steps, characteristics, and advantages of the present invention will become more apparent from the following detailed description of the preferred embodiments with reference to the attached drawings.

BRIEF DESCRIPTION OF THE DRAWINGS

FIG. 3A is a cross-sectional view in a first region of the multilayer substrate 10 according to the first preferred embodiment of the present invention, and FIG. 3B is a cross-sectional view in a second region of the multilayer substrate 10 according to the first preferred embodiment of the present invention.

DETAILED DESCRIPTION OF THE PREFERRED EMBODIMENTS

First Preferred Embodiment

Figure 1:
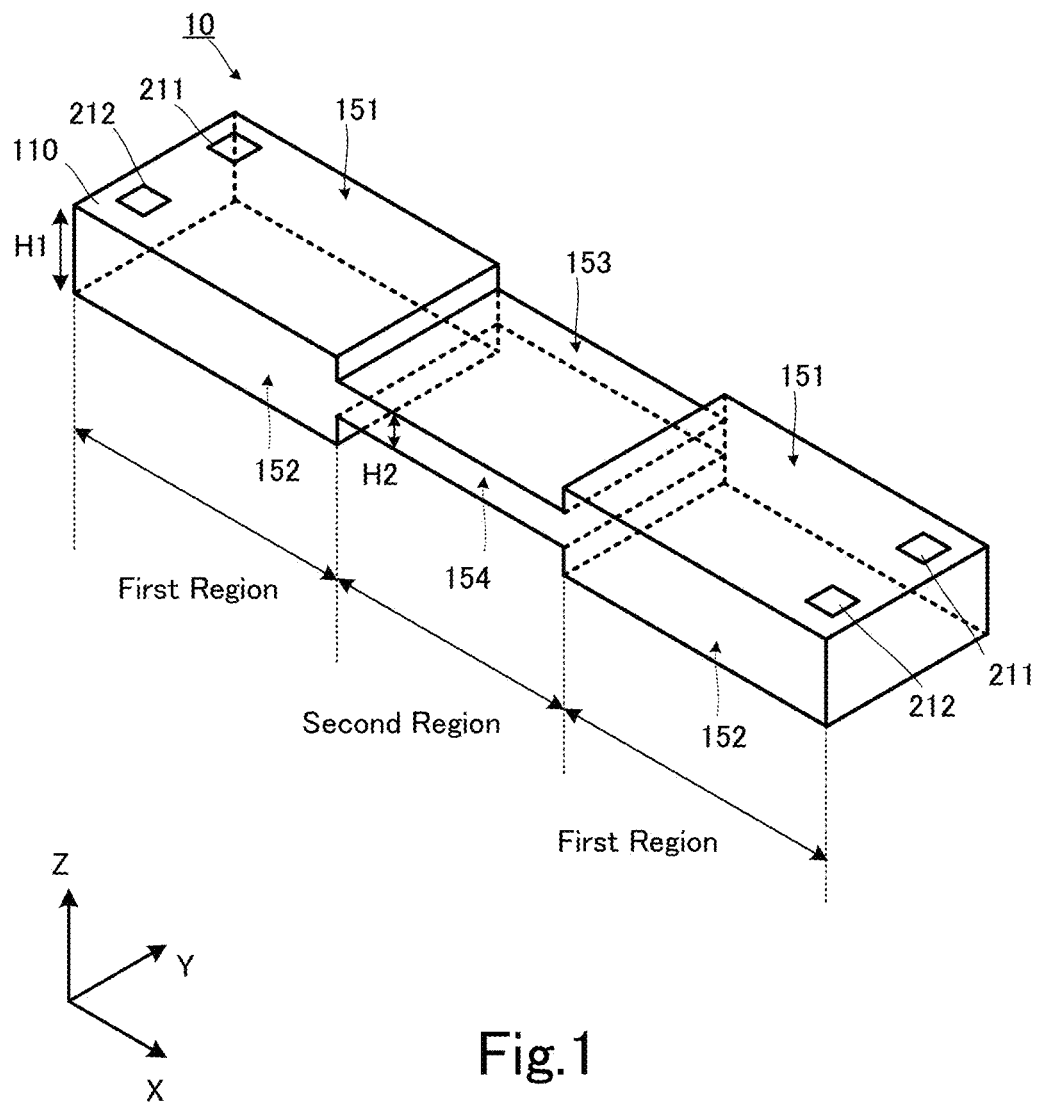
FIG. 1 is an external perspective view of a multilayer substrate 10 according to a first preferred embodiment of the present invention.
Figure 2:
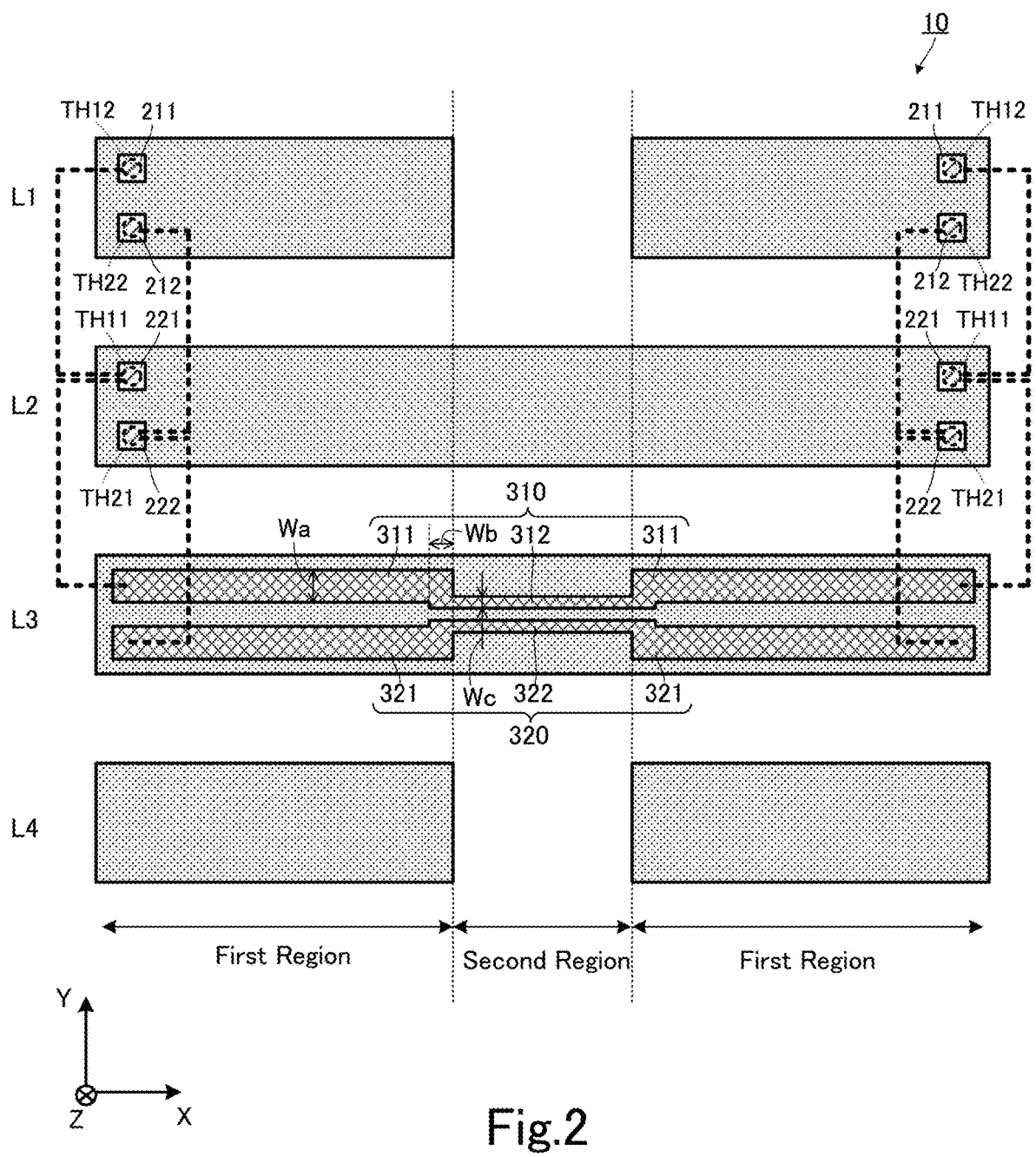
FIG. 2 is an exploded plan view of the multilayer substrate 10 according to the first preferred embodiment of the present invention.
Figure 4:
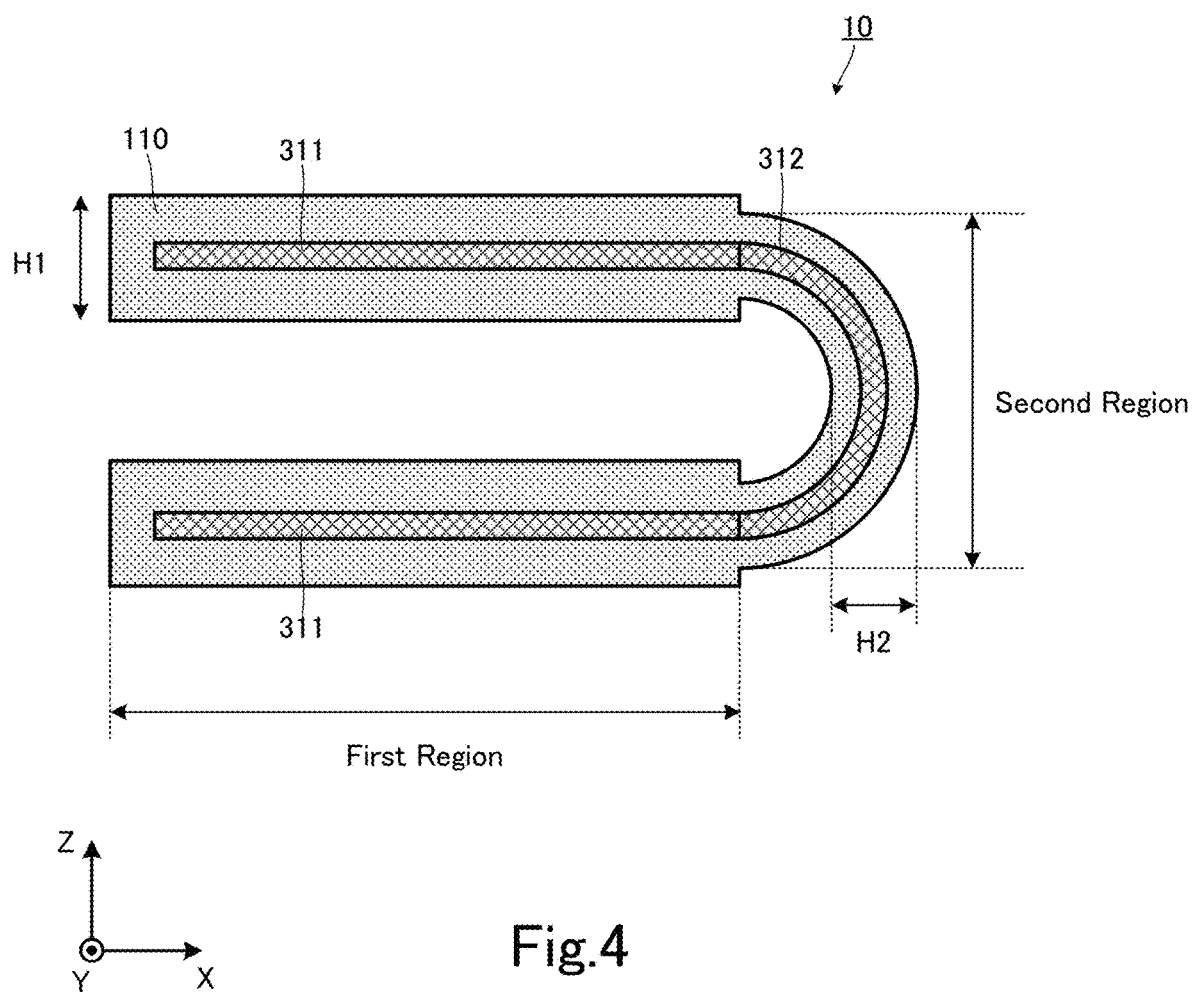
FIG. 4 is a side cross-sectional view of the multilayer substrate 10 according to the first preferred embodiment of the present invention.

A multilayer substrate according to a first preferred embodiment of the present invention will be described with reference to the drawings. FIG. 1 is an external perspective view of a multilayer substrate 10 according to the first preferred embodiment of the present invention. FIG. 2 is an exploded plan view of the multilayer substrate 10 according to the first preferred embodiment of the present invention. FIG. 3A is a cross-sectional view in a first region of the multilayer substrate 10 according to the first preferred embodiment of the present invention, and FIG. 3B is a cross-sectional view in a second region of the multilayer substrate 10 according to the first preferred embodiment of the present invention. FIG. 4 is a side cross-sectional view of the multilayer substrate 10 according to the first preferred embodiment of the present invention. In each of the drawings in the following preferred embodiments, the vertical and horizontal dimensional relationship is emphasized as appropriate, and does not always match the actual vertical and horizontal dimensional relationship. In order to make the drawings easy to see, some reference signs are omitted. In addition, in FIG. 2, wiring in the stacking direction (a Z-axis direction) is the same or substantially the same at both ends.

As shown in FIG. 1, FIG. 2, FIGS. 3A and 3B, the multilayer substrate 10 includes an insulator 110 that includes a first region and a second region, terminal electrodes 211 and 212, connection electrodes 221 and 222, a first signal line 310, and a second signal line 320. The first region and the second region of the insulator 110 have a flat plate shape.

The second region of the insulator 110 is located at a position between two first regions, and a thickness of the second region is smaller than a thickness of the first region (a length in the stacking direction is small). In other words, the thickness H2 of the second region of the insulator 110 is smaller than the thickness H1 of the first region of the insulator 110 (H1>H2).

The first region of the insulator 110 includes a first main surface 151 on one side of the insulator 110 and a second main surface 152 on the other side that faces the one side of the insulator 110. In addition, the second region of the insulator 110 includes a first main surface 153 on one side of the insulator 110 and a second main surface 154 on the other side that faces the one side of the insulator 110.

The first main surface 151 in the first region is on the same side as the first main surface 153 in the second region. Similarly, the second main surface 152 in the first region is on the same side as the second main surface 154 in the second region.

The terminal electrodes 211 and 212 are provided on the first main surface 151. Each of the terminal electrodes 211 and 212 is provided as an input-output electrode to connect to an external device.

The insulator 110 is preferably made of a polyimide type resin or LCP, for example. In addition, the insulator 110 may be made of a fluororesin, for example. More specifically, the fluororesin includes polytetrafluoroethylene (PTFE), perfluoroalkoxy alkane (PFA), ethylene-tetrafluoroethylene copolymer (ETFE), and perfluoroethylene-propene copolymer (FEP), for example. Accordingly, chemical resistance, heat resistance, and electrical characteristics are able to be increased. The first signal line 310 and the second signal line 320 are made of a material having high electrical conductivity, for example, copper (Cu). The terminal electrodes 211 and 212 and the connection electrodes 221 and 222 are planar conductors, and are made of copper foil, for example.

A more specific structure of the multilayer substrate 10 will be described. As shown in FIG. 2, the insulator 110 is defined by stacking a first layer L1, a second layer L2, a third layer L3, and a fourth layer L4 on each other.

The first layer L1 and the fourth layer L4 are provided only in the first region. The second layer L2 and the third layer L3 are provided in the first region and the second region. In other words, since the first layer L1 and the fourth layer L4 are not provided in the second region, the thickness of the second region is smaller than the thickness of the first region.

The third layer L3 includes a first signal line 310 and a second signal line 320. The first signal line 310 and the second signal line 320 have the same or substantially the same shape and are located at parallel or substantially parallel positions. Thus, the first signal line 310 and the second signal line 320 are coupled to each other and define a differential line (a coupled line). A detailed structure of the first signal line 310 and the second signal line 320 will be described below.

As described above, the terminal electrodes 211 and 212 are provided on the first layer L1 (the first main surface 151 of the insulator 110). The connection electrodes 221 and 222 are provided on the second layer L2.

Interlayer connection conductors TH12 and TH22 are provided on the first layer L1, and interlayer connection conductors TH11 and TH21 are provided on the second layer L2. The interlayer connection conductors TH11, TH12, TH21, and TH22 are provided, for example, by filling a through hole with conductive paste and solidifying the conductive paste.

The first signal line 310 is connected to the connection electrode 221 on the second layer L2 through the interlayer connection conductor TH11. The connection electrode 221 is connected to the terminal electrode 211 on the first layer L1 through the interlayer connection conductor TH12. Thus, the first signal line 310 is connected to the terminal electrode 211.

Similarly, the second signal line 320 is connected to the connection electrode 222 on the second layer L2 through the interlayer connection conductor TH21. The connection electrode 222 is connected to the terminal electrode 212 on the first layer L1 through the interlayer connection conductor TH22. Thus, the second signal line 320 is connected to the terminal electrode 212.

A more specific structure of the first signal line 310 will be described with reference to FIG. 2 and FIGS. 3A and 3B. The first signal line 310 is defined by connecting the signal line 311 and the signal line 312. The signal line 311 is provided in the first region, and the signal line 312 is provided in the second region.

The second signal line 320 is defined by connecting the signal line 321 and the signal line 322. The signal line 321 is provided in the first region, and the signal line 322 is provided in the second region.

The first signal line 310 and the second signal line 320, in the first region and the second region, are parallel or substantially parallel with an X-axis direction, and are provided on the same plane (the third layer L3).

FIG. 3A is a view of the first region as viewed in the X-axis direction, and FIG. 3B is a view of the second region as viewed in the X-axis direction. A line width W2 of the signal line 312 (the signal line 322) is smaller than a line width W1 of the signal line 311 (the signal line 321).

In addition, a distance D1 between the first signal line 310 and the second signal line 320 in the first region is larger than a distance D2 between the first signal line 310 and the second signal line 320 in the second region. In other words, the distance D2 between the first signal line 310 and the second signal line 320 in the second region is smaller than the distance D1 between the first signal line 310 and the second signal line 320 in the first region.

As a result, in the second region, the line width of the first signal line 310 and the line width of the second signal line 320 become smaller, and the distance between the first signal line 310 and the second signal line 320 becomes smaller (shorter). Thus, a coupled state between the first signal line 310 and the second signal line 320 is able to be easily maintained.

FIG. 4 is a side cross-sectional view showing a state in which the multilayer substrate 10 is bent, as viewed from the first signal line 310 in a Y-axis direction. The multilayer substrate 10 has a shape that is easily bent in the second region, and is bent in the second region that is thinner than the first region. The multilayer substrate 10 may be structured so that a second region end portion of the second region being a portion to be connected to the first region may not have a curvature. In other words, the multilayer substrate 10 may be structured to be bent in a portion of the second region. As a result, stress caused by bending is able to be further reduced or prevented from being transmitted to the first region.

As described above, the second region is thinner than the first region, and, even when the multilayer substrate 10 is bent in the second region, according to the features and structure described above, the characteristic change of the differential line in the state in which the multilayer substrate 10 is bent is significantly reduced or prevented, and desired characteristics are able to be provided.

In addition, the multilayer substrate 10 may preferably have, for example, the following relationship with the signal line in the first region, the signal line in the second region, and a connecting portion. The connecting portion is a portion that connects the signal line in the first region and the signal line in the second region. The connecting portion defines a direction (the Y-axis direction) perpendicular or substantially perpendicular to a transmission direction (the X-axis direction) of the signal line in the first region and the signal line in the second region, as a transmission direction of the signal.

A width Wb (a length parallel or substantially parallel with the X-axis direction) of the connecting portion is smaller than a width Wa (a length parallel or substantially parallel with the Y-axis direction) of the signal line 311 in the first region, and larger than a width Wc (a length parallel with the Y-axis direction) of the signal line 312 in the second region. In other words, the width Wa of the signal line 311 in the first region, the width Wb of the connecting portion, and the width Wc of the signal line 312 in the second region are reduced in this order. As a result, an abrupt change in impedance in the connecting portion of the first region and the second region is able to be significantly reduced or prevented, and a transmission loss is able to be reduced.

Second Preferred Embodiment

Figure 5:
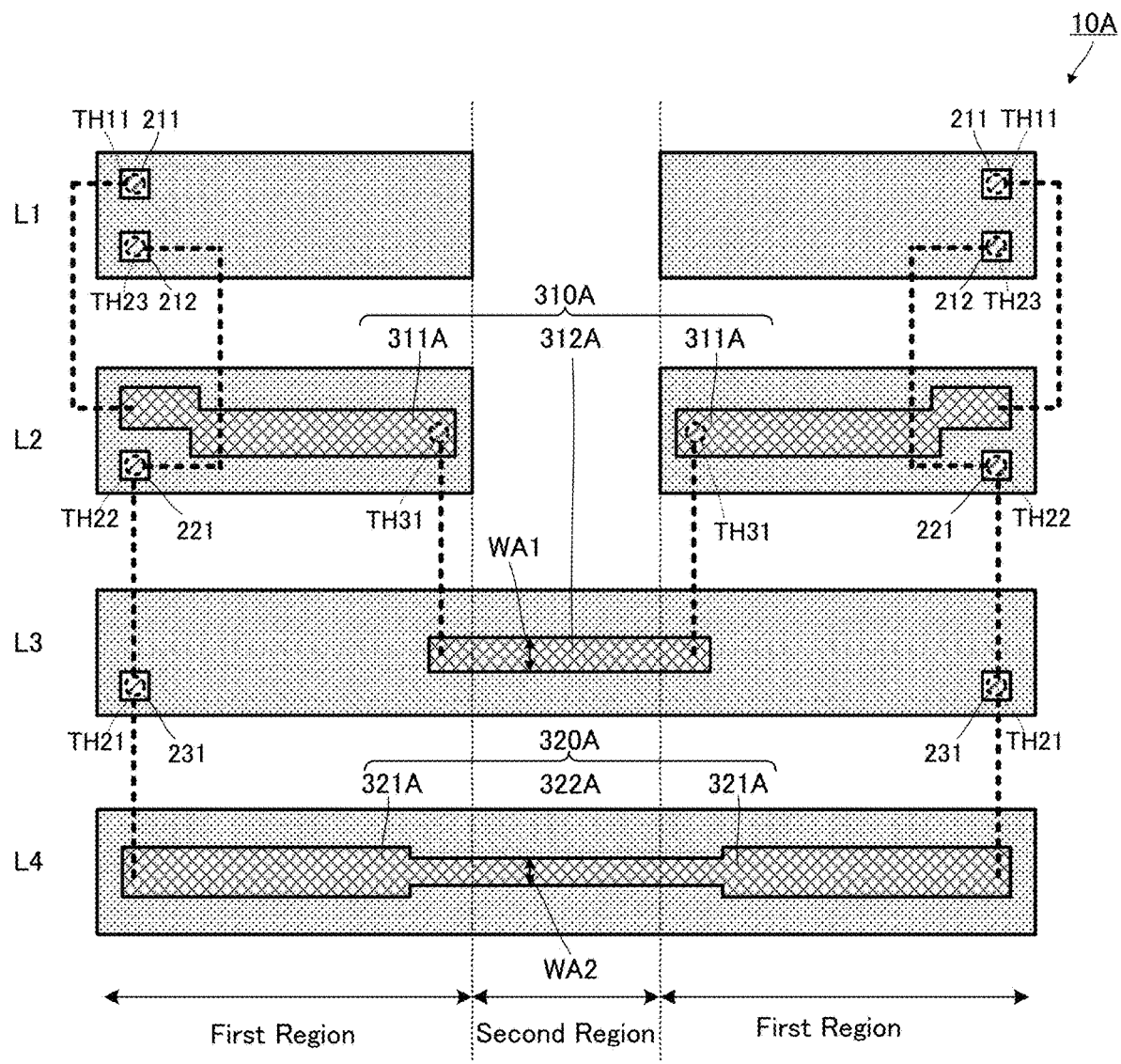
FIG. 5 is an exploded plan view of a multilayer substrate 10A according to a second preferred embodiment of the present invention.
Figure 6:
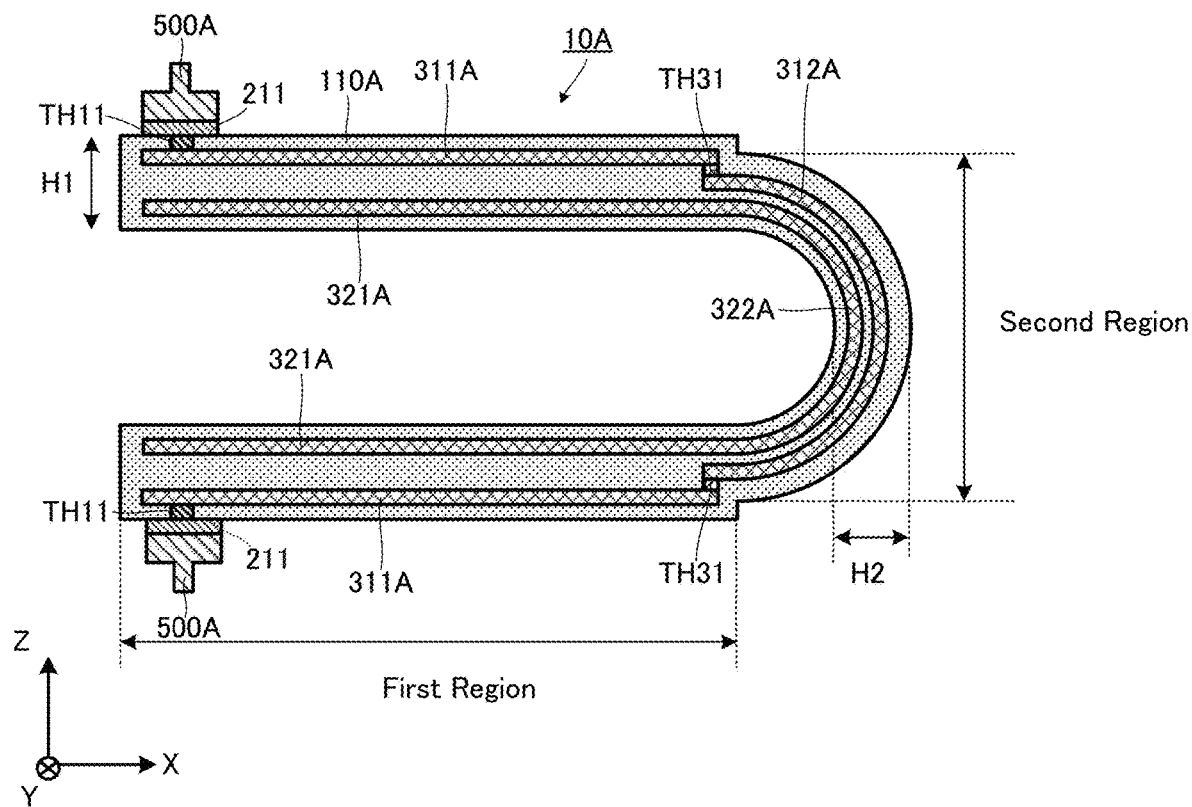
FIG. 6 is a side cross-sectional view of the multilayer substrate 10A according to the second preferred embodiment of the present invention.

A multilayer substrate according to a second preferred embodiment of the present invention will be described with reference to the drawings. FIG. 5 is an exploded plan view of a multilayer substrate 10A according to the second preferred embodiment of the present invention. FIG. 6 is a side cross-sectional view of the multilayer substrate 10A according to the second preferred embodiment of the present invention. In FIG. 5, wiring in a stacking direction (the Z-axis direction) is substantially the same at both ends.

As shown in FIG. 5 and FIG. 6, the multilayer substrate 10A according to the second preferred embodiment of the present invention is different from the multilayer substrate 10 according to the first preferred embodiment of the present invention in the shape of a first signal line 310A, the shape of a second signal line 320A, the structure of the first signal line 310A and the second signal line 320A that face each other in the Z-axis direction, the inclusion of a connection electrode 231, and the shapes of a second layer L2 and a fourth layer L4. Other basic features of the multilayer substrate 10A are the same as or similar to the basic features of the multilayer substrate 10, and a description of the same or similar features will be omitted.

The multilayer substrate 10A includes an insulator 110A that includes a first region and a second region, and the first layer L1 and the second layer L2 are provided only in the first region of the insulator 110A. The third layer L3 and the fourth layer L4 are provided in the first region and the second region of the insulator 110A. In other words, since the first layer L1 and the second layer L2 are not provided in the second region, the thickness of the second region is smaller than the thickness of the first region.

The first signal line 310A includes a signal line 311A and a signal line 312A. The signal line 311A is provided in the first region of the second layer L2, and the signal line 312A is provided in the second region of the third layer L3.

Interlayer connection conductors TH11 and TH23 are provided in the first layer L1. Interlayer connection conductors TH22 and TH31 are provided in the second layer L2. An interlayer connection conductor TH21 is provided in the third layer L3. The interlayer connection conductors TH11, TH21, TH22, TH23, and TH31 are provided, for example, by filling a through hole with conductive paste and solidifying the conductive paste.

The first signal line 310A is defined by connecting the signal line 311A and the signal line 312A by the interlayer connection conductor TH31. The first signal line 310A is connected to a terminal electrode 211 on the first layer L1 through the interlayer connection conductor TH11. Thus, the first signal line 310A is connected to the terminal electrode 211.

The second signal line 320A is defined by connecting a signal line 321A and a signal line 322A. The signal line 321A is provided in the first region, and the signal line 322A is provided in the second region.

In addition, the second signal line 320A is connected to a connection electrode 231 on the third layer L3 through the interlayer connection conductor TH21. The connection electrode 231 is connected to a terminal electrode 221 on the second layer L2 through the interlayer connection conductor TH22. The connection electrode 221 is connected to a terminal electrode 212 on the first layer L1 through the interlayer connection conductor TH23. Thus, the second signal line 320A is connected to the terminal electrode 212.

The first signal line 310A and the second signal line 320A are provided at positions that are parallel or substantially parallel with the X-axis direction and face each other in the Z-axis direction. Thus, the first signal line 310A and the second signal line 320A define a differential line (a coupled line).

In addition, the interlayer connection conductor TH31 is provided in the first signal line 310A near a first main surface 151 on which the terminal electrodes 211 and 212 are provided. In other words, the interlayer connection conductor TH31 extends in a direction (toward the second signal line 320A) in which the first signal line 310A near the first main surface 151 is spaced apart from the terminal electrode 211. Thus, the line length of the signal line from one terminal electrode 211 to the other terminal electrode 211 through the first signal line 310A is able to be approximated to the line length of the signal line from one terminal electrode 212 to the other terminal electrode 212 through the second signal line 320A, so that deviations in impedance are able to be reduced.

In the Y-axis direction of the second region, the line width WA1 of the signal line 312A in the first signal line 310A is preferably larger than the line width WA2 of the signal line 322A in the second signal line 320A, for example. Thus, the first signal line 310A, even when shifting in the Y-axis direction in a plan view of the multilayer substrate 10A in the Z-axis direction, overlaps with the second signal line 320A more easily. In other words, the influence of a positional shift at a time when the multilayer substrate 10A is provided is able to be reduced.

FIG. 6 is a side cross-sectional view of a state in which the multilayer substrate 10A is bent. The multilayer substrate 10A is bent in the second region that is thinner than the first region. The first signal line 310A (the signal line 311A) is connected to a connector 500A through the terminal electrode 211. Although the illustration is omitted in FIG. 6, the second signal line 320A (the signal line 321A) is connected to the connector 500A through the terminal electrode 212. In addition, the connector 500A is connected to another component (the illustration is omitted).

The multilayer substrate 10A is preferably bent so that the fourth layer L4 may face inside, for example. Thus, the first signal line 310A (the signal line 312A) extends. In other words, the length of the first signal line 310A is able to be further approximated to the length of the second signal line 320A.

Even with the features described above, a coupled state between the first signal line 310A and the second signal line 320A is able to be maintained. In addition, the second region is thinner than the first region, and, even when the multilayer substrate 10A is bent in the second region, the characteristic change of the differential line in the state in which the multilayer substrate 10A is bent is significantly reduced or prevented, and desired characteristics are able to be provided. Moreover, a difference in the length of the first signal line 310A and the second signal line 320A is able to be reduced.

Furthermore, in the second region, the distance between the signal line 322A and a curved inner surface of the multilayer substrate 10A is smaller than the distance between the signal line 312A and a curved outer surface of the multilayer substrate 10A. As a result, the conductor is brought closer to a curved inner region, the second region is more easily bent.

Third Preferred Embodiment

Figure 7:
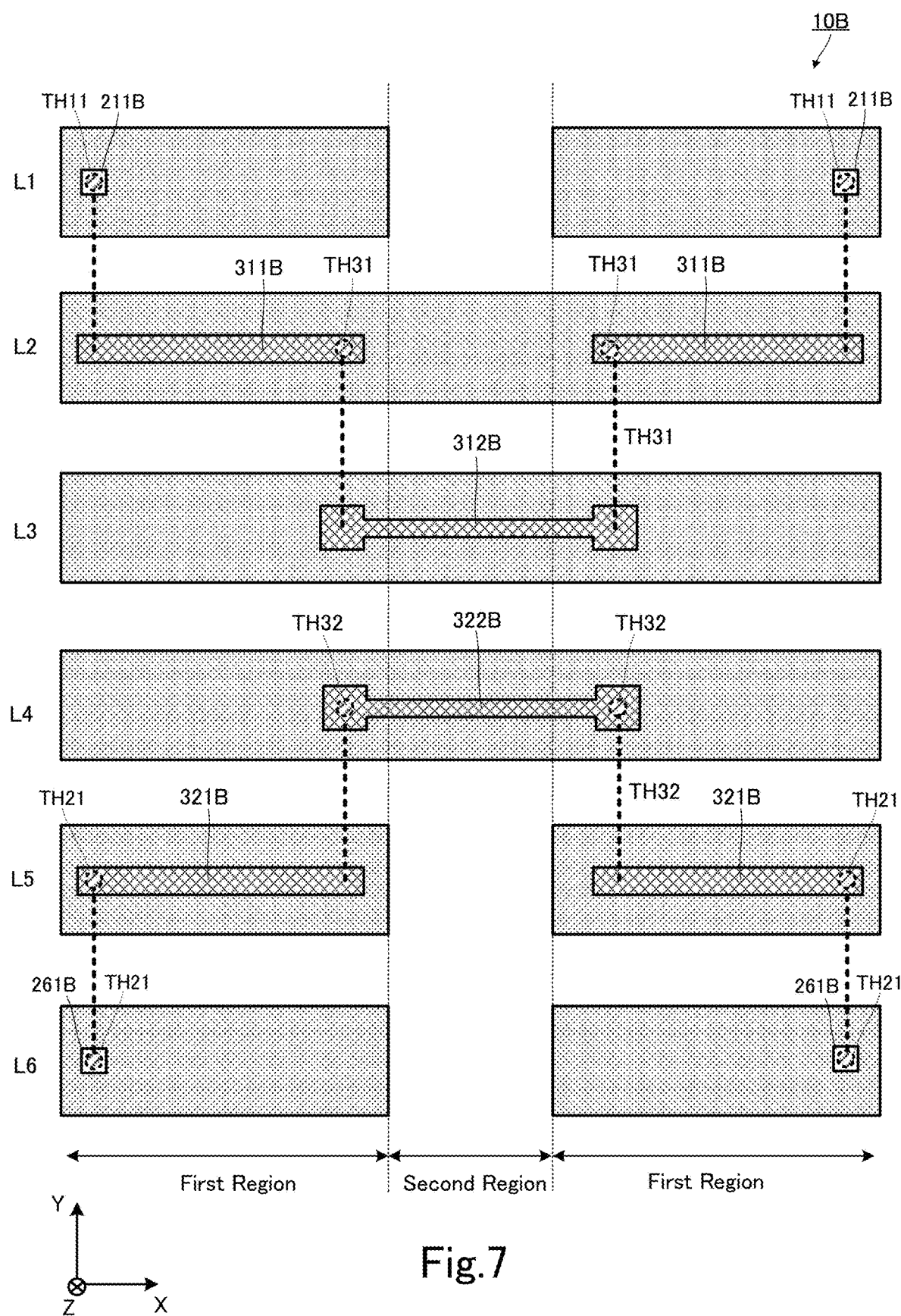
FIG. 7 is an exploded plan view of a multilayer substrate 10B according to a third preferred embodiment of the present invention.
Figure 8:
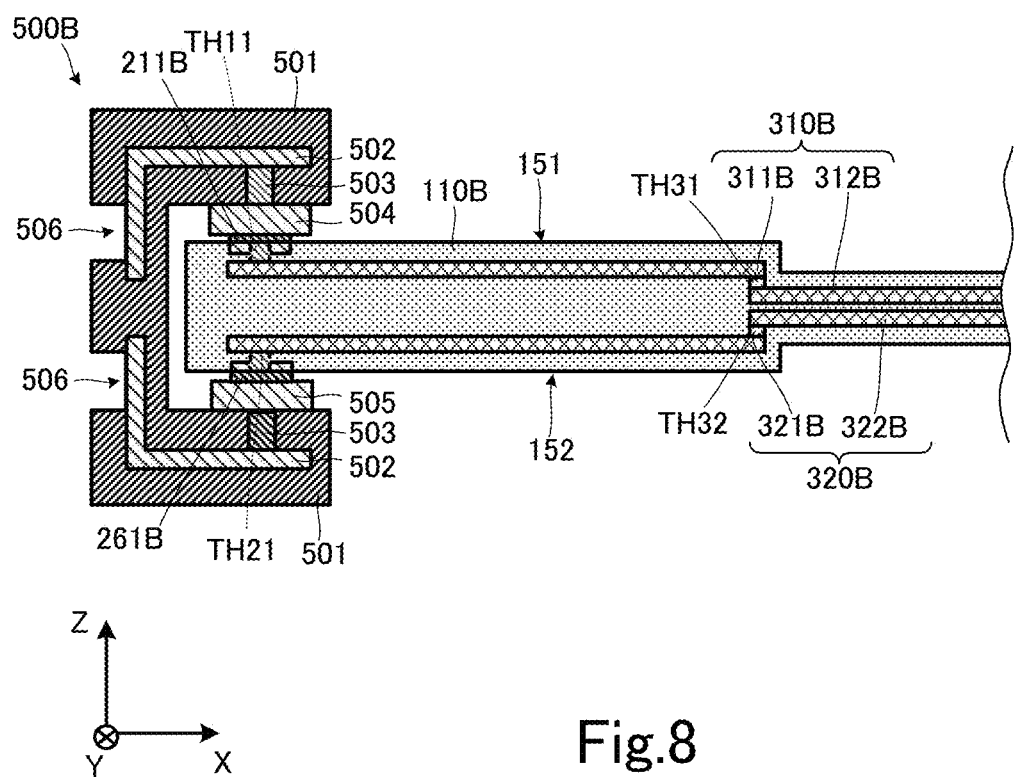
FIG. 8 is a side cross-sectional view showing a state in which the multilayer substrate 10B according to the third preferred embodiment of the present invention is connected to a connector 500B.

A multilayer substrate according to a third preferred embodiment of the present invention will be described with reference to the drawings. FIG. 7 is an exploded plan view of a multilayer substrate 10B according to the third preferred embodiment of the present invention. FIG. 8 is a side cross-sectional view showing a state in which the multilayer substrate 10B according to the third preferred embodiment of the present invention is connected to a connector 500B. In FIG. 7, the wiring in the stacking direction (the Z-axis direction) is the same or substantially the same at both ends.

As shown in FIG. 7 and FIG. 8, the multilayer substrate 10B according to the third preferred embodiment is different from the multilayer substrate 10A according to the second preferred embodiment in the inclusion of a fifth layer L5 and a sixth layer L6, the shapes of a first signal line 310B and a second signal line 320B, and the inclusion of a terminal electrode 211B and a terminal electrode 261B. Other basic features of the multilayer substrate 10B are the same as or similar to the basic features of the multilayer substrate 10A, and a description of the same or similar features will be omitted. The sixth layer L6 corresponds to a surface on the side of the second main surface 152.

The multilayer substrate 10B includes an insulator 110B that includes a first region and a second region, and a first layer L1, the fifth layer L5, and the sixth layer L6 are provided only in the first region of the insulator 110B. In other words, the first layer L1, the fifth layer L5, and the sixth layer L6 are not provided in the second region of the insulator 110B. Specifically, the thickness of the second region of the multilayer substrate 10B is smaller than the thickness of the first region.

The terminal electrode 211B is provided on the first layer L1, and the terminal electrode 261B is provided on the sixth layer L6. The surface on which the terminal electrode 211B is provided corresponds to the first main surface 151, and the surface on which the terminal electrode 261B is provided corresponds to the second main surface 152.

An interlayer connection conductor TH11 is provided in the first layer L1. An interlayer connection conductor TH31 is provided in the second layer L2. An interlayer connection conductor TH32 is provided in the fourth layer L4. An interlayer connection conductor TH21 is provided in the fifth layer L5. The interlayer connection conductors TH11, TH21, TH31, and TH32 are provided, for example, by filling a through hole with conductive paste and solidifying the conductive paste.

The first signal line 310B is defined by connecting the signal line 311B and the signal line 312B. The signal line 311B is provided in the first region of the second layer L2. The signal line 312B is provided in the second region of the third layer L3. The signal line 311B and the signal line 312B are connected by the interlayer connection conductor TH31. The line width of the signal line 312B is smaller than the line width of the signal line 311B.

The first signal line 310B is connected to a terminal electrode 211B on the first layer L1 through the interlayer connection conductor TH11. Thus, the first signal line 310B is connected to the terminal electrode 211B.

The second signal line 320B is defined by connecting a signal line 321B and a signal line 322B. The signal line 321B is provided in the first region of the fifth layer L5. The signal line 322B is provided in the second region of the fourth layer L4. The signal line 321B and the signal line 322B are connected by the interlayer connection conductor TH32. The line width of the signal line 322B is smaller than the line width of the signal line 321B.

The second signal line 320B is connected to the terminal electrode 261B on the sixth layer L6 through the interlayer connection conductor TH21. Thus, the second signal line 320B is connected to the terminal electrode 261B.

The first signal line 310B and the second signal line 320B are provided at positions that are substantially parallel with the X-axis direction and face each other in the Z-axis direction. Thus, the first signal line 310B and the second signal line 320B define a differential line (a coupled line).

Accordingly, the length of the first signal line 310B and the second signal line 320B are able to be equal or substantially to each other. In other words, a distance from the terminal electrode 211B on one end to the terminal electrode 211B on another end and a distance from the terminal electrode 261B on one end to the terminal electrode 261B on another end are able to be equal or substantially equal to each other.

FIG. 8 is a side cross-sectional view of the multilayer substrate 10B as viewed in the Y-axis direction, showing a structure in which the multilayer substrate 10B is connected to the connector 500B. The connector 500B includes a connector housing 501, a wiring conductor 502, a connection conductor 503, contact terminals 504 and 505, and an external connection opening 506. The connection terminals 504 and 505 are connected to the wiring conductor 502 through the connection conductor 503. The wiring conductor 502 is exposed outside when the connector housing 501 includes the external connection opening 506. The exposed portion is provided as an input-output electrode to connect to an external device.

In the Z-axis direction of the multilayer substrate 10B, the connector 500B is structured to include at least a portion of a first main surface 151 and at least a portion of a second main surface 152. The multilayer substrate 10B connects the connection terminal 504 and the terminal electrode 211B, and connects the connection terminal 505 and the terminal electrode 261B. Then, as described above, the external connection opening 506 is provided as an input-output electrode, and the multilayer substrate 10B is able to be connected to an external device.

Even with the features described above, a coupled state between the first signal line 310B and the second signal line 320B is able to be maintained, and the characteristic change is able to be further reduced or prevented.

In addition, in multilayer substrate 10B, the first layer L1 to the third layer L3 and the fourth layer L4 to the sixth layer L6 have a line symmetric structure. Moreover, with the connector 500B including the features described above, the distance between the connection terminal 504 and the terminal electrode 211B is equal or substantially equal to the distance between the connection terminal 505 and the terminal electrode 261B. As a result, in the structure of the connector 500B and the multilayer substrate 10B, a transmission loss is able to be reduced.

In addition, similarly to the above-described preferred embodiments, the second region is thinner than the first region, so that the multilayer substrate 10B easily bends (is easily bent) in the second region, the characteristic change of the differential line in the state in which the multilayer substrate 10B is bent is significantly reduced or prevented, and desired characteristics are able to be provided.

Fourth Preferred Embodiment

Figure 9:
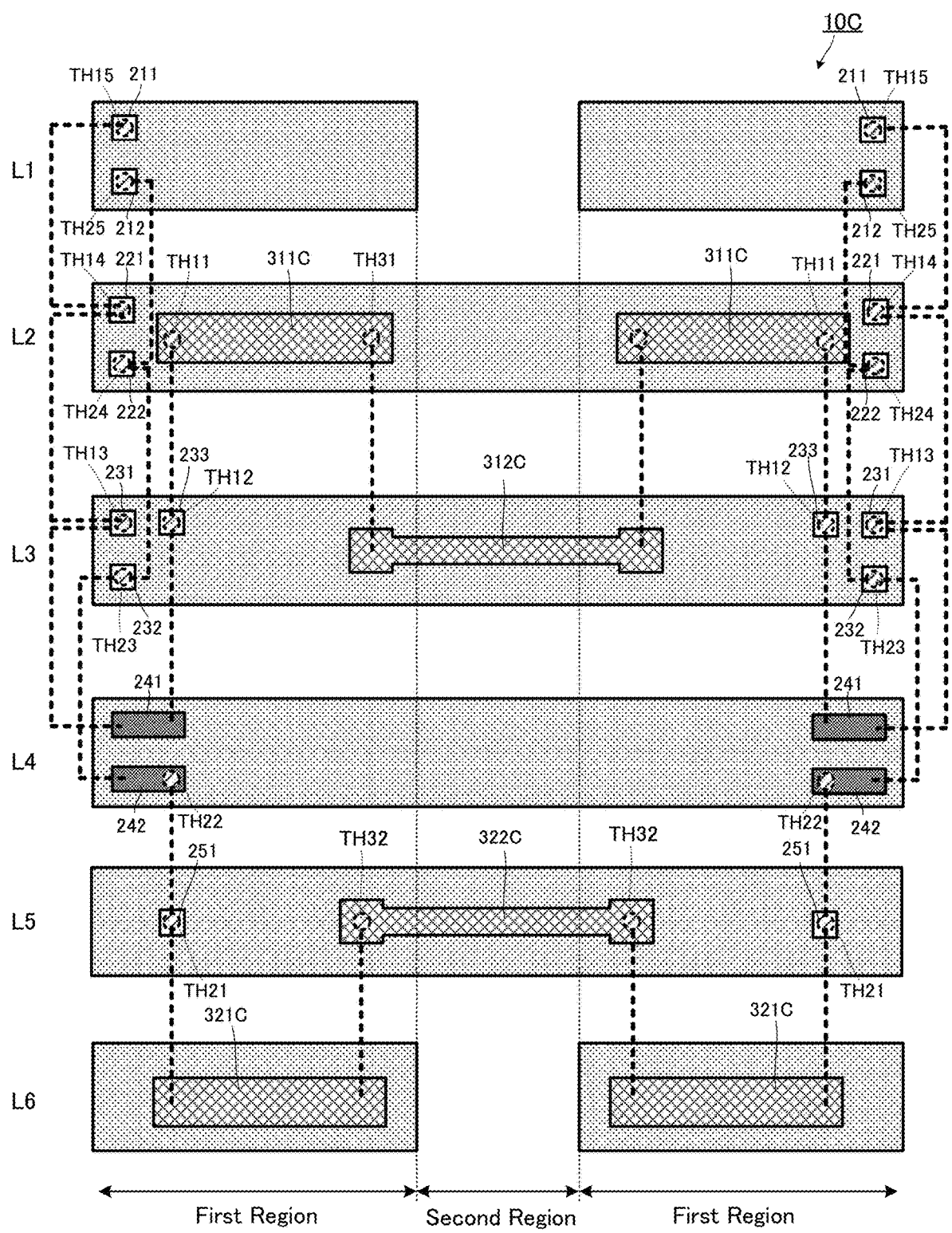
FIG. 9 is an exploded plan view of a multilayer substrate 10C according to a fourth preferred embodiment of the present invention.
Figure 10A:
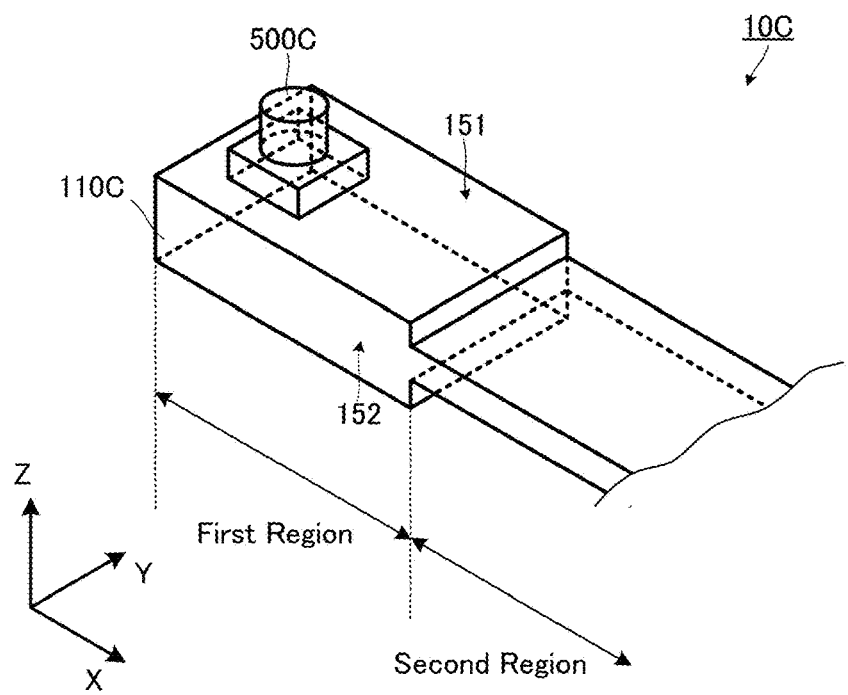
FIG. 10A is an external perspective view of the multilayer substrate 10C according to the fourth preferred embodiment of the present invention.
Figure 10B:
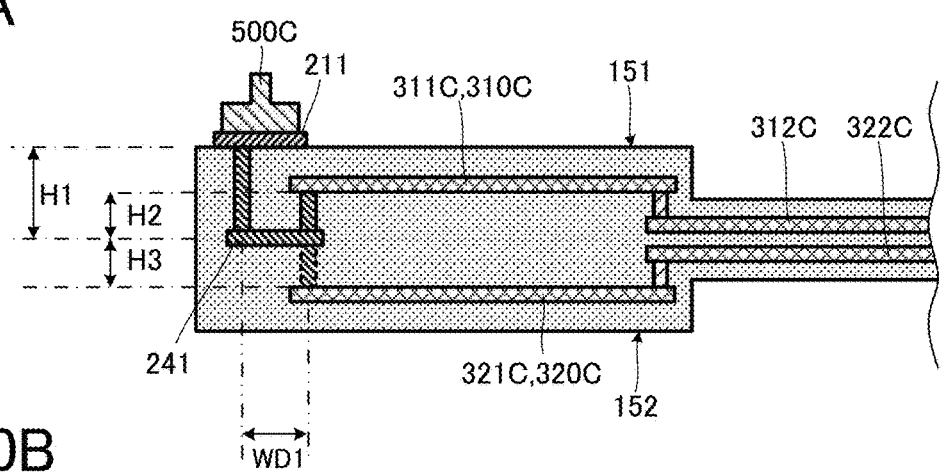
FIGS. 10B and 10C are side cross-sectional views of the multilayer substrate 10C according to the fourth preferred embodiment of the present invention.
Figure 10C:
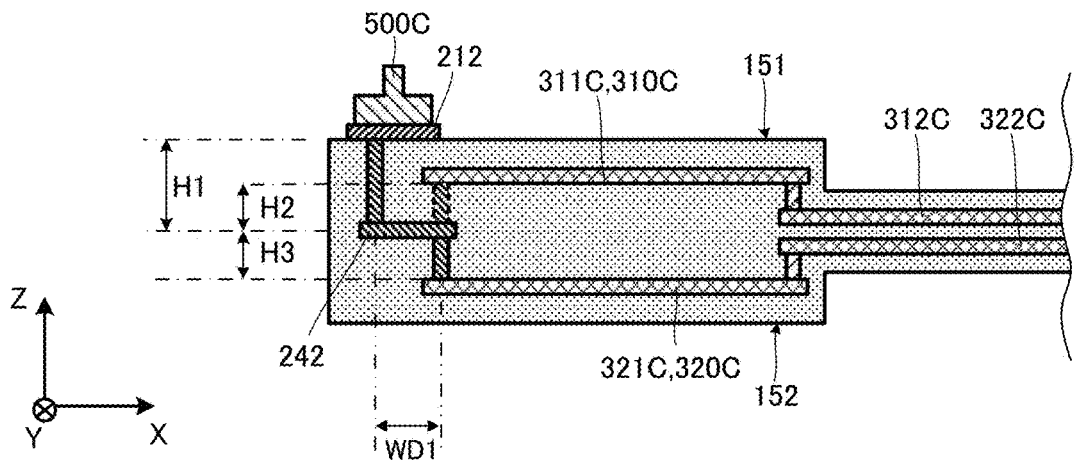

A multilayer substrate according to a fourth preferred embodiment of the present invention will be described with reference to the drawings. FIG. 9 is an exploded plan view of a multilayer substrate 10C according to the fourth preferred embodiment of the present invention. FIG. 10A is an external perspective view of the multilayer substrate 10C according to the fourth preferred embodiment of the present invention, and FIGS. 10B and 10C are side cross-sectional views of the multilayer substrate 10C according to the fourth preferred embodiment of the present invention. In FIG. 9, the wiring in a stacking direction (the Z-axis direction) is the same or substantially the same at both ends.

As shown in FIG. 9, and FIGS. 10A to 10C, the multilayer substrate 10C according to the fourth preferred embodiment is different from the multilayer substrate 10A according to the second preferred embodiment in the inclusion of a fifth layer L5 and a sixth layer L6, the shapes of a first signal line 310C and a second signal line 320C, and the inclusion of terminal electrodes 211 and 212, connection electrodes 221, 222, 231, 232, 233, and 251, and conductor patterns 241 and 242. Other basic features of the multilayer substrate 10C are the same as or similar to the basic features of the multilayer substrate 10A, and a description of the same or similar features will be omitted.

In the multilayer substrate 10C, the first layer L1 and the sixth layer L6 are provided only in a first region. In other words, since the first layer L1 and the sixth layer L6 are not provided in the second region, the thickness of the second region is smaller than the thickness of the first region.

The terminal electrodes 211 and 212 are provided on the first layer L1. The connection electrodes 221 and 222 are provided on the second layer L2. The connection electrodes 231, 232, and 233 are provided on the third layer L3. The conductor patterns 241 and 242 are provided on the fourth layer L4. The connection electrode 251 is provided on the fifth layer L5. The surface on which the terminal electrodes 211 and 212 are provided corresponds to the first main surface 151.

As shown in FIG. 9, an interlayer connection conductor TH31 is provided in the second layer L2. An interlayer connection conductor TH32 is provided in the fifth layer L5. The interlayer connection conductors TH31 and TH32 are provided, for example, by filling a through hole with conductive paste and solidifying the conductive paste.

The first signal line 310C is defined by connecting the signal line 311C and the signal line 312C. The signal line 311C is provided in the first region of the second layer L2, and the signal line 312C is provided in the second region of the third layer L3. The signal line 311C and the signal line 312C are connected by the interlayer connection conductor TH31. The line width of the signal line 312C is smaller than the line width of the signal line 311C.

The second signal line 320C is defined by connecting a signal line 321C and a signal line 322C. The signal line 321C is provided in the first region of the sixth layer L6, and the signal line 322C is provided in the second region of the fifth layer L5. The signal line 321C and the signal line 322C are connected by the interlayer connection conductor TH32. The line width of the signal line 322C is smaller than the line width of the signal line 321C.

The first signal line 310C and the second signal line 320C are provided at positions that are parallel or substantially parallel with the X-axis direction and face each other in the Z-axis direction. Thus, the first signal line 310C and the second signal line 320C define a differential line (a coupled line).

A structure in which the first signal line 310C is connected to a connector 500C will be described with reference to FIG. 9 and FIGS. 10A and 10B. The first signal line 310C is connected to the connector 500C through the terminal electrode 211.

The connector 500C shown in FIGS. 10A to 10C is connected to the terminal electrodes 211 and 212 on a first main surface 151 of an insulator 110C.

Interlayer connection conductors TH15 and TH25 are provided in the first layer L1. Interlayer connection conductors TH11, TH14, and TH24 are provided in the second layer L2. Interlayer connection conductors TH12, TH13, and TH23 are provided in the third layer L3. An interlayer connection conductor TH22 is provided in the fourth layer L4. An interlayer connection conductor TH21 is provided in the fifth layer L5. The interlayer connection conductors TH11, TH12, TH13, TH14, TH15, TH21, TH22, TH23, TH24, and TH25 are provided, for example, by filling a through hole with conductive paste and solidifying the conductive paste.

A connection structure of the first signal line 310C will be described. The signal line 311C on the second layer L2 is connected to the connection electrode 233 on the third layer L3 through the interlayer connection conductor TH11. In the third layer L3, the connection electrode 233 is connected to the conductor pattern 241 on the fourth layer L4 through the interlayer connection conductor TH12. The conductor pattern 241 is connected to the connection electrode 231 on the third layer L3 through the interlayer connection conductor TH13. The connection electrode 231 is connected to the connection electrode 221 on the second layer L2 through the interlayer connection conductor TH14. The connection electrode 221 is connected to the terminal electrode 211 on the first layer L1 through the interlayer connection conductor TH15. Accordingly, the first signal line 310C is connected to the terminal electrode 211 on the first layer L1.

Similarly, a structure in which the second signal line 320C is connected to the connector 500C will be described with reference to FIG. 9 and FIGS. 10A and 10O. The second signal line 320C is connected to the connector 500C through the terminal electrode 212.

A connection structure of the second signal line 320C will be described. The signal line 321C on the sixth layer L6 is connected to the connection electrode 251 on the fifth layer L5 through the interlayer connection conductor TH21. The connection electrode 251 is connected to the conductor pattern 242 on the fourth layer L4 through the interlayer connection conductor TH22. The conductor pattern 242 is connected to the connection electrode 232 on the third layer L3 through the interlayer connection conductor TH23. The connection electrode 232 is connected to the connection electrode 222 on the second layer L2 through the interlayer connection conductor TH24. The connection electrode 222 is connected to the terminal electrode 212 on the first layer L1 through the interlayer connection conductor TH25. Accordingly, the second signal line 320C is connected to the terminal electrode 212 on the first layer L1.

The distance from the first signal line 310C to the terminal electrode 211 is compared with the distance from the second signal line 320C to the terminal electrode 212.

In the first signal line 310C shown in FIG. 9 and FIG. 10B, a thickness H2 (a length in a thickness direction) is equal or substantially equal to a length of the interlayer connection conductor TH11+a length of the interlayer connection conductor TH12, and a thickness H1 is equal or substantially equal to a length of the interlayer connection conductor TH13+a length of the interlayer connection conductor TH14+a length of interlayer connection conductor TH15.

In the second signal line 320C shown in FIG. 9 and FIG. 10C, a thickness H3 (a length in the thickness direction) is equal or substantially equal to a length of the interlayer connection conductor TH21+a length of the interlayer connection conductor TH22, and a thickness H1 is equal or substantially equal to a length of the interlayer connection conductor TH23+a length of the interlayer connection conductor TH24+a length of interlayer connection conductor TH25.

In other words, the distance from the first signal line 310C to the terminal electrode 211 is equal or substantially equal to H1+H2+a length of the conductor pattern 241. In addition, the distance from the second signal line 320C to the terminal electrode 212 is equal or substantially equal to H1+H3+a length of the conductor pattern 242. The length of the conductor pattern 241 and the length of the conductor pattern 242 are equal or substantially equal to each other.

The second layer L2, the third layer L3, the fourth layer L4, and the fifth layer L5 that define the insulator 110C have the same or substantially the same thickness in the Z-axis direction, H2=H3 is satisfied. Therefore, the distance from the first signal line 310C to the terminal electrode 211 is equal or substantially equal to the distance from the second signal line 320C to the terminal electrode 212.

In other words, the connection structure of the first signal line 310C corresponds to a structure including a wiring portion that passes (bypasses) the interlayer connection conductors TH11 and TH12. In other words, the structure does not provide a conductor at a minimum distance, but includes a portion to purposely increase the length of the conductor. The distance of the interlayer connection conductors TH21 and TH22 of the second signal line 320C is offset by such a wiring portion. Thus, the distance from the first signal line 310C to the terminal electrode 211 is able to be equal or substantially to the distance from the second signal line 320C to the terminal electrode 212.

Even with the features described above, the second region is thinner than the first region, so that the multilayer substrate 10C easily bends (is easily bent) in the second region, the characteristic change of the differential line in the state in which the multilayer substrate 10C is bent is significantly reduced or prevented, and desired characteristics are able to be provided. Further, the distance from the first signal line 310C to the terminal electrode 211 and the distance from the second signal line 320C to the terminal electrode 212 are equal or substantially equal to each other, so that the difference between the two line lengths is reduced and a transmission loss of the multilayer substrate 10C is able to be reduced.

In addition, a coupled state between the first signal line 310C and the second signal line 320C is able to be maintained, and the characteristic change is able to be further reduced or prevented.

Fifth Preferred Embodiment

Figure 11:
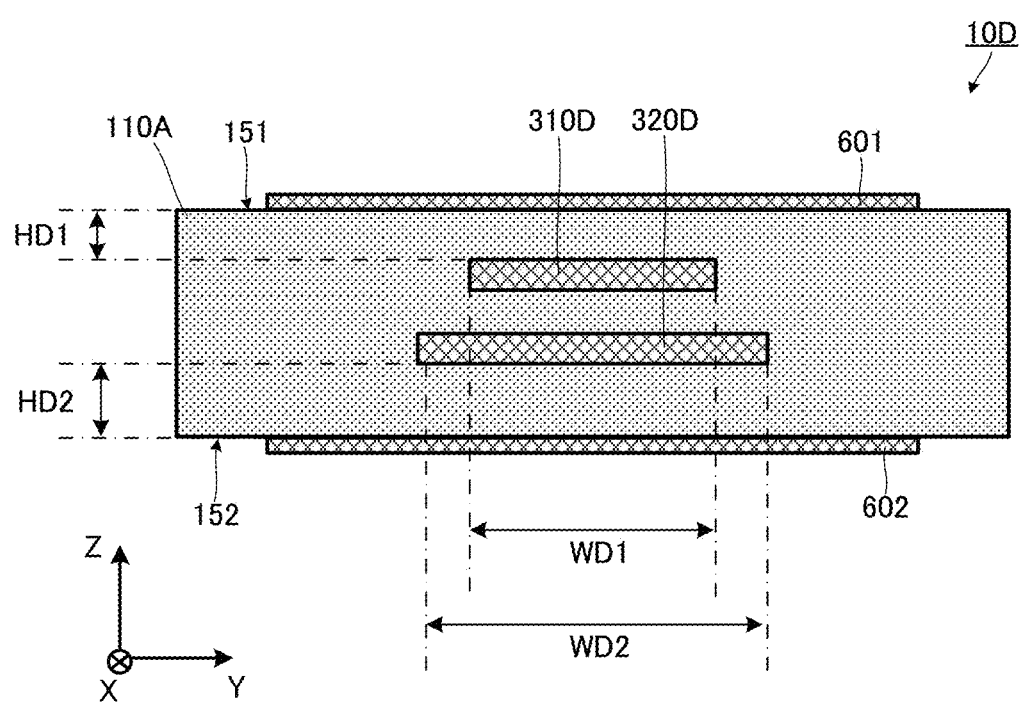
FIG. 11 is a side cross-sectional view of a multilayer substrate 10D according to a fifth preferred embodiment of the present invention.

A multilayer substrate according to a fifth preferred embodiment of the present invention will be described with reference to the drawings. FIG. 11 is a side cross-sectional view of a multilayer substrate 10D according to the fifth preferred embodiment of the present invention.

As shown in FIG. 11, the multilayer substrate 10D according to the fifth preferred embodiment is different from the multilayer substrate 10A according to the second preferred embodiment in the inclusion of ground conductors 601 and 602, and the line widths and positions of a first signal line 310D and a second signal line 320D. Other basic features of the multilayer substrate 10D are the same as or similar to the basic features of the multilayer substrate 10, and a description of the same or similar features will be omitted.

In the Y-axis direction of the multilayer substrate 10D, a line width WD1 of the first signal line 310D is smaller than a line width WD2 of the second signal line 320D. Thus, the first signal line 310D, even in a case of shifting in the Y-axis direction when the multilayer substrate 10D is viewed in the Z-axis direction, overlaps with the second signal line 320D. In other words, the influence of a positional shift at a time when the multilayer substrate 10D is provided is able to be reduced.

The ground conductor 601 is provided on a first main surface 151 of the multilayer substrate 10D. The ground conductor 602 is provided on a second main surface 152 of the multilayer substrate 10D. More specifically, the line widths of the ground conductor 601 and the ground conductor 602 are larger than the line widths of the first signal line 310D and the second signal line 320D in the Y-axis direction. Thus, noise that is generated from the first signal line 310D and the second signal line 320D is able to be reduced or prevented from being emitted to the outside of the multilayer substrate 10D. The ground conductor 601 corresponds to a "first ground conductor", and the ground conductor 602 corresponds to a "second ground conductor".

In addition, in the Z-axis direction of the multilayer substrate 10D, the first signal line 310D is spaced apart from the first main surface 151 by a distance HD1. In other words, the first signal line 310D is spaced apart from the ground conductor 601 by the distance HD1.

Similarly, the second signal line 320D is spaced apart from the second main surface 152 by a distance HD2. In other words, the second signal line 320D is spaced apart from the ground conductor 602 by the distance HD2.

As described above, the line width WD1 of the first signal line 310D is provided to be smaller than the line width WD2 of the second signal line 320D. Accordingly, the first signal line 310D and the second signal line 320D may satisfy the relationship of distance HD1<distance HD2. As a result, the effect of making the impedance of the first signal line 310D and the second signal line 320D the same or substantially the same is provided.

The above-described preferred embodiments describe a structure in which the ground conductor 601 is provided on the first main surface 151 and the ground conductor 602 is provided on the second main surface 152. However, as long as at least one of the ground conductors is provided, the noise that is generated from the first signal line 310D and the second signal line 320D is able to be reduced or prevented from being emitted to the outside of the multilayer substrate 10D. However, for example, the ground conductors may be preferably provided on both sides of the first main surface 151 and the second main surface 152 to increase the effect of reducing noise that is emitted to the outside of the multilayer substrate 10D.

Even with the features described above, a coupled state between the first signal line 310D and the second signal line 320D is able to be maintained. In addition, the second region is thinner than the first region, so that the multilayer substrate 10D easily bends (is easily bent) in the second region, the characteristic change of the differential line in the state in which the multilayer substrate 10D is bent is significantly reduced or prevented, and desired characteristics are able to be provided.

By including a layer (the second layer L2 in the multilayer substrate 10 of the first preferred embodiment, for example) on which the first signal line and the second signal line are not provided in the second region, the second region is omissible. As a result, the second region is able to be further thinned, and thus the multilayer substrate 10D is able to be more easily bent.

In addition, with respect to the fifth preferred embodiment, a structure in which the widths of the first signal line and the second signal line are equal or substantially equal to each other and the first signal line and the second signal line are provided in parallel or substantially in parallel with each other in the Y-axis direction and provided between two ground conductors is able to be used. Accordingly, the advantageous operational effect by including the ground conductor, that is, the advantageous effect of reducing the noise that is emitted to the outside, is able to be increased.

In addition, with respect to the fifth preferred embodiment, a structure in which the two ground conductors are omitted is able to be used. In this structure, the advantageous operational effect by the first signal line and the second signal line that are provided along in the Z-axis direction (the thickness direction of the insulator) and have different widths, that is, influence of a positional shift when a multilayer substrate is provided, is able to be reduced.

The above-described preferred embodiments describe a structure in which the connecting portion that connects the signal line in the first region and the signal line in the second region has a shape to define a direction perpendicular or substantially perpendicular to a transmission direction of the signal line in the first region and the signal line in the second region as a signal transmission direction. However, the connecting portion may have a shape shown in FIG. 12.

Figure 12:
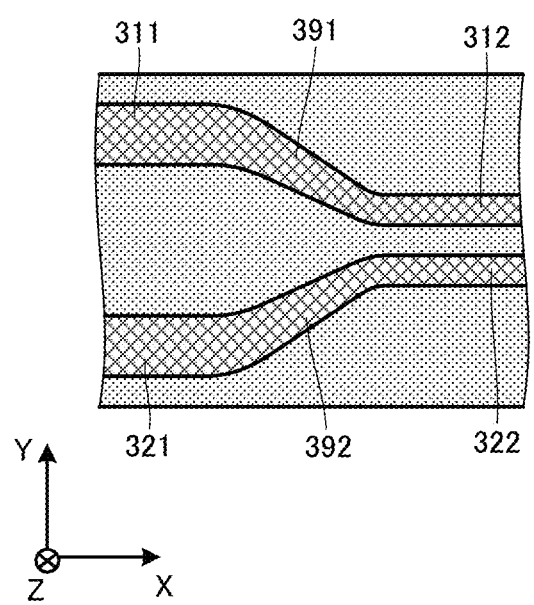
FIG. 12 is an enlarged plan view showing another connecting portion that connects a signal line in the first region and a signal line in the second region.

FIG. 12 is an enlarged plan view showing another connecting portion that connects a signal line in the first region and a signal line in the second region. The multilayer substrate shown in FIG. 12 is different from the multilayer substrate 10 according to the first preferred embodiment in the shape of the connecting portion that connects the signal line in the first region and the signal line in the second region. Other basic features of the multilayer substrate shown in FIG. 12 are the same as or similar to the basic features of the multilayer substrate 10, and a description of the same or similar features will be omitted.

In the multilayer substrate shown in FIG. 12, the signal line 311 in the first region and the signal line 312 in the second region are connected by a connecting portion 391. In addition, the signal line 321 in the first region and the signal line 322 in the second region are connected by a connecting portion 392.

The connecting portion 391 has the same or substantially the same width as the signal line 311 at a connection end to the signal line 311, and has the same or substantially the same width as the signal line 312 at a connection end to the signal line 312. The width of the signal line 311 is larger than the width of the signal line 312. The connecting portion 391 has a shape in which the width is gradually tapered from the connection end to the signal line 311 toward the connection end to the signal line 312.

The connecting portion 392 has the same or substantially the same width as the signal line 321 at a connection end to the signal line 321, and has the same or substantially the same width as the signal line 322 at a connection end to the signal line 322. The width of the signal line 321 is larger than the width of the signal line 322. The connecting portion 392 has a shape in which the width is gradually tapered from the connection end to the signal line 321 toward the connection end to the signal line 322.

According to the features described above, a drastic change in impedance in the connecting portion 391 and the connecting portion 392 is able to be further reduced or prevented, so that a transmission loss is able to be further reduced. In addition, connection between the connection portion 391 and the signal line 311, connection between the connection portion 391 and the signal line 312, connection between the connection portion 392 and the signal line 321, and connection between the connection portion 392 and the signal line 322 have no corner portion in the conductor pattern. Accordingly, unnecessary concentration of an electric field or the like on the corner portion does not occur, and a transmission loss is able to be reduced.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:
an insulator including:
a plurality of layers stacked on each other in a stacking direction;
a first region; and
a second region that is thinner than the first region in the stacking direction;

a first signal line and a second signal line that are structured to extend across the first region and the second region and that overlap in a planar view in the stacking direction; and a first ground conductor and a second ground conductor that are provided on an outside of regions in which the first signal line and the second signal line are provided in the stacking direction; wherein in a region in which the first signal line and the second signal line face each other:
  a line width of the first signal line and a line width of the second signal line are smaller in the second region than in the first region; and
  a distance between the first signal line and the second signal line is smaller in the second region than in the first region;

the first ground conductor overlaps with the first signal line and is closer to the first signal line than to the second signal line in the planar view in the stacking direction;

the second ground conductor overlaps with the first signal line and is closer to the second signal line than to the first signal line in the planar view in the stacking direction; and the first signal line and the second signal line are provided between the first ground conductor and the second ground conductor in the stacking direction.

2. The multilayer substrate according to claim 1, wherein the second region is at least partially bent.

3. The multilayer substrate according to claim 1, wherein the first signal line and the second signal line are provided on different layers in the first region and the second region and face each other in the stacking direction.

4. The multilayer substrate according to claim 3, further comprising:
  a first main surface located on a first side in the stacking direction; and
  a second main surface located on a second side that faces the first main surface in the stacking direction; wherein
  the first signal line is located at a position closer to the first main surface than the second signal line;
  the first signal line includes an input-output electrode, and the input-output electrode of the first signal line is provided on the first main surface; and
  the second signal line includes an input-output electrode, and the input-output electrode of the second signal line is provided on the second main surface.

5. The multilayer substrate according to claim 3, further comprising:
  a first main surface located on a first side in the stacking direction; wherein
  the first signal line includes an input-output electrode, the second signal line includes an input-output electrode, and the input-output electrode of the first signal line and the input-output electrode of the second signal line are provided on the first main surface;
  the first signal line is located at a position closer to the first main surface than the second signal line; and
  the first signal line extends on a layer at a position in the stacking direction closer to the second signal line in the second region than in the first region.

6. The multilayer substrate according to claim 3, further comprising:
  a first main surface located on a first side in the stacking direction; and
  a second main surface located on a second side that faces the first main surface in the stacking direction; wherein
  the first signal line includes an input-output electrode, the second signal line includes an input-output electrode, and the input-output electrode of the first signal line and the input-output electrode of the second signal line are provided on the first main surface;
  the first signal line is located at a position in the stacking direction closer to the first main surface than the second signal line; and
  a wiring portion that bypasses toward the second main surface is provided between the input-output electrode of the first signal line and the first signal line.

7. The multilayer substrate according to claim 1, wherein, in at least one of the first region and the second region, the line width of the first signal line is different from the line width of the second signal line.

8. The multilayer substrate according to claim 7, wherein one of the line width of the first signal line and the line width of the second signal line is larger than the other.

9. The multilayer substrate according to claim 1, wherein a distance between the first ground conductor and the first signal line is smaller than a distance between the second ground conductor and the second signal line.

10. The multilayer substrate according to claim 1, wherein
  the insulator includes a third region;
  the second region is thinner than the third region; and
  the second region is located at a position between the first region and the third region.

11. The multilayer substrate according to claim 10, wherein the first signal line and the second signal line extend to the third region.

12. The multilayer substrate according to claim 1, wherein
  the insulator is defined by stacking a first layer, a second layer, a third layer, and a fourth layer on each other;
  the first layer and the fourth layer are provided only in the first region; and
  the second layer and the third layer are provided in each of the first region and the second region.

13. The multilayer substrate according to claim 12, wherein the third layer includes the first signal line and the second signal line.

14. The multilayer substrate according to claim 13, wherein a first terminal electrode and a second terminal electrode are provided on the first layer.

15. The multilayer substrate according to claim 14, wherein
  the first signal line is connected to the first terminal electrode by at least one first interlayer connection conductor; and
  the second signal line is connected to the second terminal electrode by at least one second interlayer connection conductor.

16. The multilayer substrate according to claim 14, wherein at least one connection electrode is provided on the second layer.

* * * * *